(12) United States Patent
Kobayashi

(10) Patent No.: US 10,643,824 B2
(45) Date of Patent: May 5, 2020

(54) PLASMA GENERATING APPARATUS, PLASMA PROCESSING APPARATUS, AND METHOD OF CONTROLLING PLASMA GENERATING APPARATUS

(71) Applicant: Tokyo Electron Limited, Tokyo (JP)

(72) Inventor: Takeshi Kobayashi, Iwate (JP)

(73) Assignee: Tokyo Electron Limited, Tokyo (JP)

(*) Notice: Subject to any disclaimer, the term of this patent is extended or adjusted under 35 U.S.C. 154(b) by 179 days.

(21) Appl. No.: 15/713,880

(22) Filed: Sep. 25, 2017

(65) Prior Publication Data
US 2018/0096826 A1 Apr. 5, 2018

(30) Foreign Application Priority Data
Oct. 3, 2016 (JP) .................. 2016-195783

(51) Int. Cl.
*H01J 37/32* (2006.01)
(52) U.S. Cl.
CPC .... *H01J 37/32743* (2013.01); *H01J 37/3266* (2013.01); *H01J 37/32082* (2013.01); *H01J 37/3299* (2013.01); *H01J 37/32532* (2013.01); *H01J 37/32541* (2013.01); *H01J 37/32935* (2013.01)
(58) Field of Classification Search
CPC .......... H01J 37/32743; H01J 37/32082; H01J 37/3266; H01J 37/32541; H01J 37/32532; H01J 37/3299; H01J 37/32935
See application file for complete search history.

(56) References Cited

U.S. PATENT DOCUMENTS

| | | | | |
|---|---|---|---|---|
| 6,284,668 B1* | 9/2001 | Imahashi | .......... | H01J 37/32357 216/38 |
| 2013/0047923 A1* | 2/2013 | Kato | ................ | H01L 21/02164 118/723 AN |
| 2016/0301089 A1* | 10/2016 | Sato | .................. | H01M 8/04029 |

FOREIGN PATENT DOCUMENTS

| | | | |
|---|---|---|---|
| JP | 2002216817 A | * | 8/2002 |
| JP | 2003347099 A | * | 12/2003 |
| JP | 2004-165345 A | | 6/2004 |
| JP | 2013-161874 A | | 8/2013 |

* cited by examiner

*Primary Examiner* — Yuechuan Yu
(74) *Attorney, Agent, or Firm* — Abelman, Frayne & Schwab

(57) ABSTRACT

A plasma generating apparatus according to the present disclosure includes: a high frequency power supply that generates a high frequency power; a plasma generation electrode connected to the high frequency power supply and formed by a hollow tube in which cooling water is distributed; a conductivity meter that measures conductivity of the cooling water inside the plasma generation electrode; and a controller that controls output of the high frequency power supply based on the conductivity of the cooling water measured by the conductivity meter.

9 Claims, 9 Drawing Sheets

PLASMA GENERATING APPARATUS, PLASMA PROCESSING APPARATUS, AND METHOD OF CONTROLLING PLASMA GENERATING APPARATUS

CROSS-REFERENCE TO RELATED APPLICATIONS

This application is based on and claims priority from Japanese Patent Application No. 2016-195783, filed on Oct. 3, 2016, with the Japan Patent Office, the disclosure of which is incorporated herein in its entirety by reference.

TECHNICAL FIELD

The present disclosure relates to a plasma generating apparatus, a plasma processing apparatus, and a method of controlling the plasma generating apparatus.

BACKGROUND

In the related art, there has been known an inductively coupled plasma generating apparatus which generates plasma inside a processing chamber by supplying a high frequency power to a spiral coil electrode disposed outside the processing chamber to generate a magnetic field inside the processing chamber.

In this plasma generating apparatus, the coil electrode is formed by a hollow tube made of a copper, and cooling water is circulated inside the hollow tube so that the coil electrode is suppressed from being heated to a high temperature due to the high frequency power supplied to the coil electrode (see, e.g., Japanese Laid-Open Patent Publication Nos. 2004-165345 and 2013-161874).

SUMMARY

An aspect of the present disclosure provides a plasma generating apparatus including: a high frequency power supply that generates a high frequency power; a plasma generation electrode connected to the high frequency power supply and formed by a hollow tube in which cooling water is distributed; a conductivity meter that measures conductivity of the cooling water inside the plasma generation electrode; and a controller that controls output of the high frequency power supply based on the conductivity of the cooling water measured by the conductivity meter.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
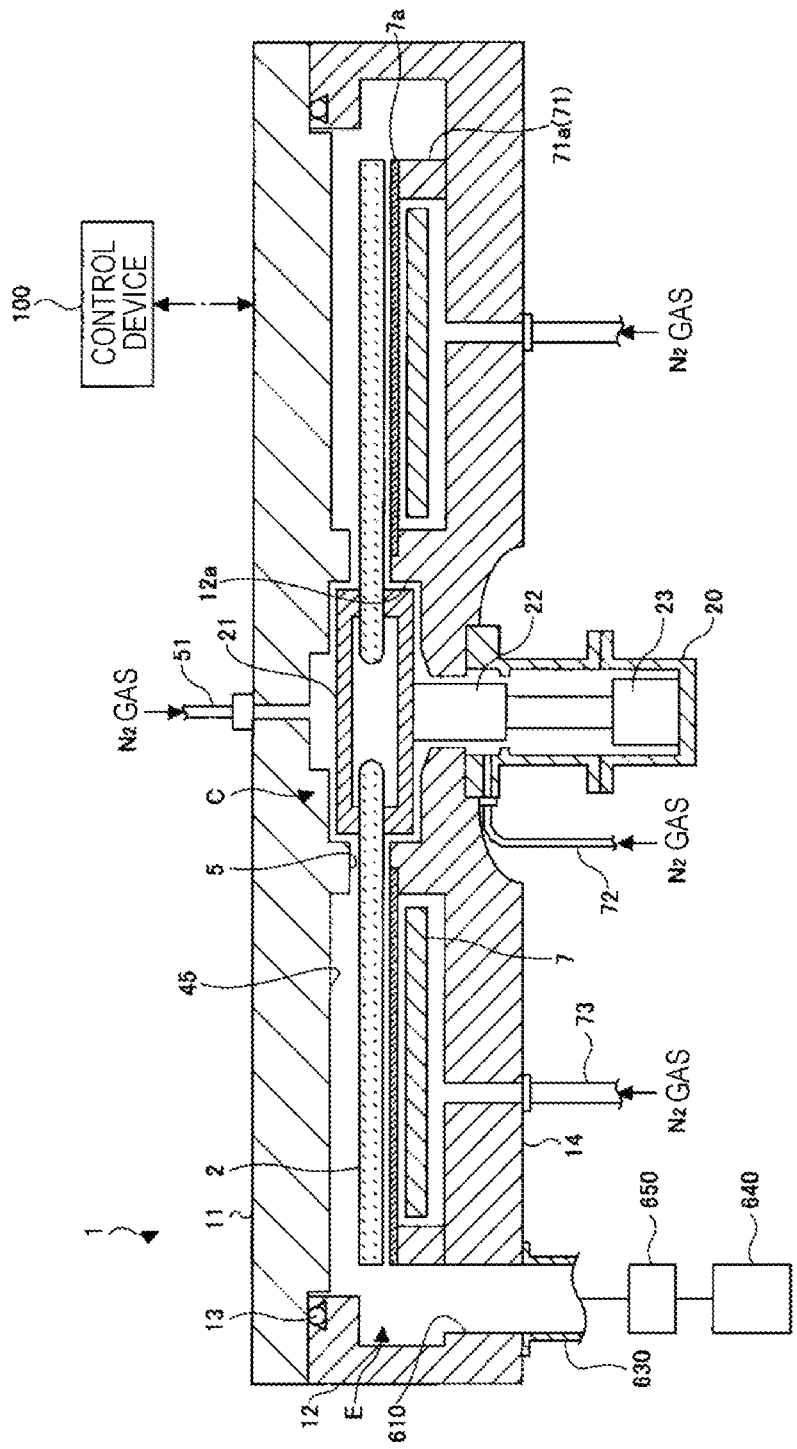
FIG. 1 is a schematic sectional view of a plasma processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described plasma generating apparatus, when the conductivity of the cooling water circulated inside the hollow tube varies, the impedance of the coil electrode changes, and as a result, the state of plasma generated inside the processing chamber changes. The change in the state of the plasma affects processing results of, for example, a film formation or etching performed inside the processing chamber.

Thus, in an aspect, an object of the present disclosure is to provide a plasma generating apparatus in which the change of the state of the plasma may be suppressed.

In order to achieve the object, an aspect of the present disclosure provides a plasma generating apparatus including: a high frequency power supply that generates a high frequency power; a plasma generation electrode connected to the high frequency power supply and formed by a hollow tube in which cooling water is distributed; a conductivity meter that measures conductivity of the cooling water inside the plasma generation electrode; and a controller that controls output of the high frequency power supply based on the conductivity of the cooling water measured by the conductivity meter.

In the above-described plasma generating apparatus, the controller controls the output of the high frequency power supply to increase when the conductivity of the cooling water measured by the conductivity meter is larger than a predetermined value, and controls the output of the high frequency power supply to decrease when the conductivity of the cooling water measured by the conductivity meter is smaller than the predetermined value.

The above-described plasma generating apparatus further includes an alarm device that makes an alarm sound, and the controller controls whether the alarm device makes an alarm sound, based on the conductivity of the cooling water measured by the conductivity meter.

In the above-described plasma generating apparatus, when the conductivity of the cooling water does not fall within a predetermined range including the predetermined value, the controller controls the alarm device to make an alarm sound.

In the above-described plasma generating apparatus, the conductivity meter is provided in a flow path of the cooling water supplied into the plasma generation electrode.

In the above-described plasma generating apparatus, the plasma generation electrode is formed in a coil shape.

Another aspect of the present disclosure provides a plasma processing apparatus including: a processing chamber; a placing unit provided inside the processing chamber and configured to place a substrate on an upper surface thereof; a processing gas supply unit provided above the placing unit and configured to supply a processing gas to the upper surface of the placing unit; and a plasma generating apparatus that activates the processing gas supplied by the processing gas supply unit. The plasma generating apparatus includes: a high frequency power supply that generates a high frequency power; a plasma generation electrode connected to the high frequency power supply and formed by a hollow tube in which cooling water is distributed; a conductivity meter that measures conductivity of the cooling water inside the plasma generation electrode; and a controller that controls output of the high frequency power supply based on the conductivity of the cooling water measured by the conductivity meter.

Still another aspect of the present disclosure provides a method of controlling a plasma generating apparatus which generates plasma by supplying a high frequency power to a plasma generation electrode formed by a hollow tube in which cooling water is distributed. The method includes: measuring conductivity of the cooling water inside the plasma generation electrode; and controlling the high frequency power based on the measured conductivity of the cooling water.

According to the plasma generating apparatus of the present disclosure, the change of the state of plasma may be suppressed.

Hereinafter, exemplary embodiments for implementing the present disclosure will be described with reference to the accompanying drawings. In the descriptions and the drawings, substantially similar configurations will be denoted by a common reference numeral, and overlapping descriptions are omitted.

(Plasma Processing Apparatus)

Figure 2:
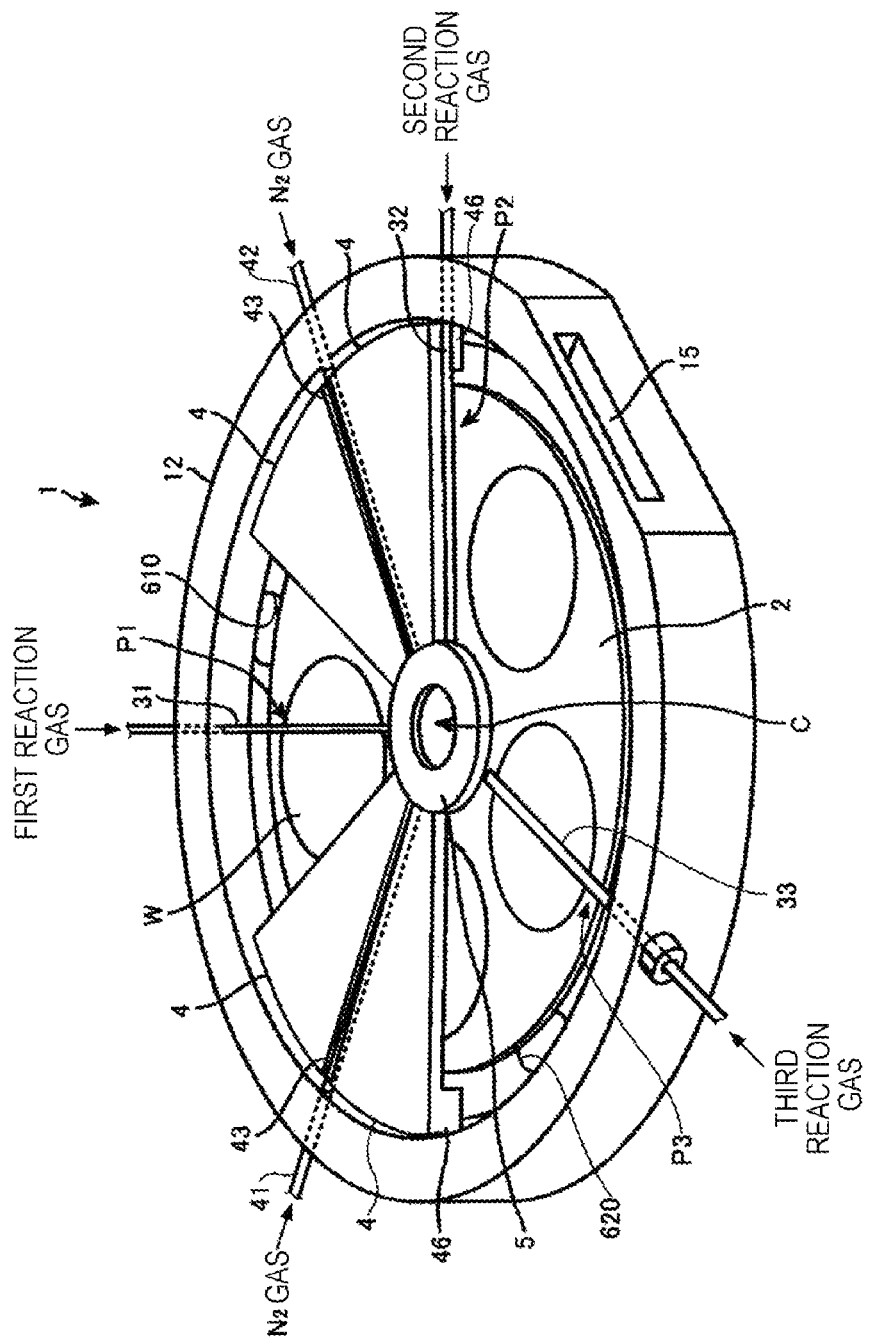
FIG. 2 is a schematic perspective view illustrating an internal configuration of a vacuum vessel of the plasma processing apparatus of FIG. 1.
Figure 3:
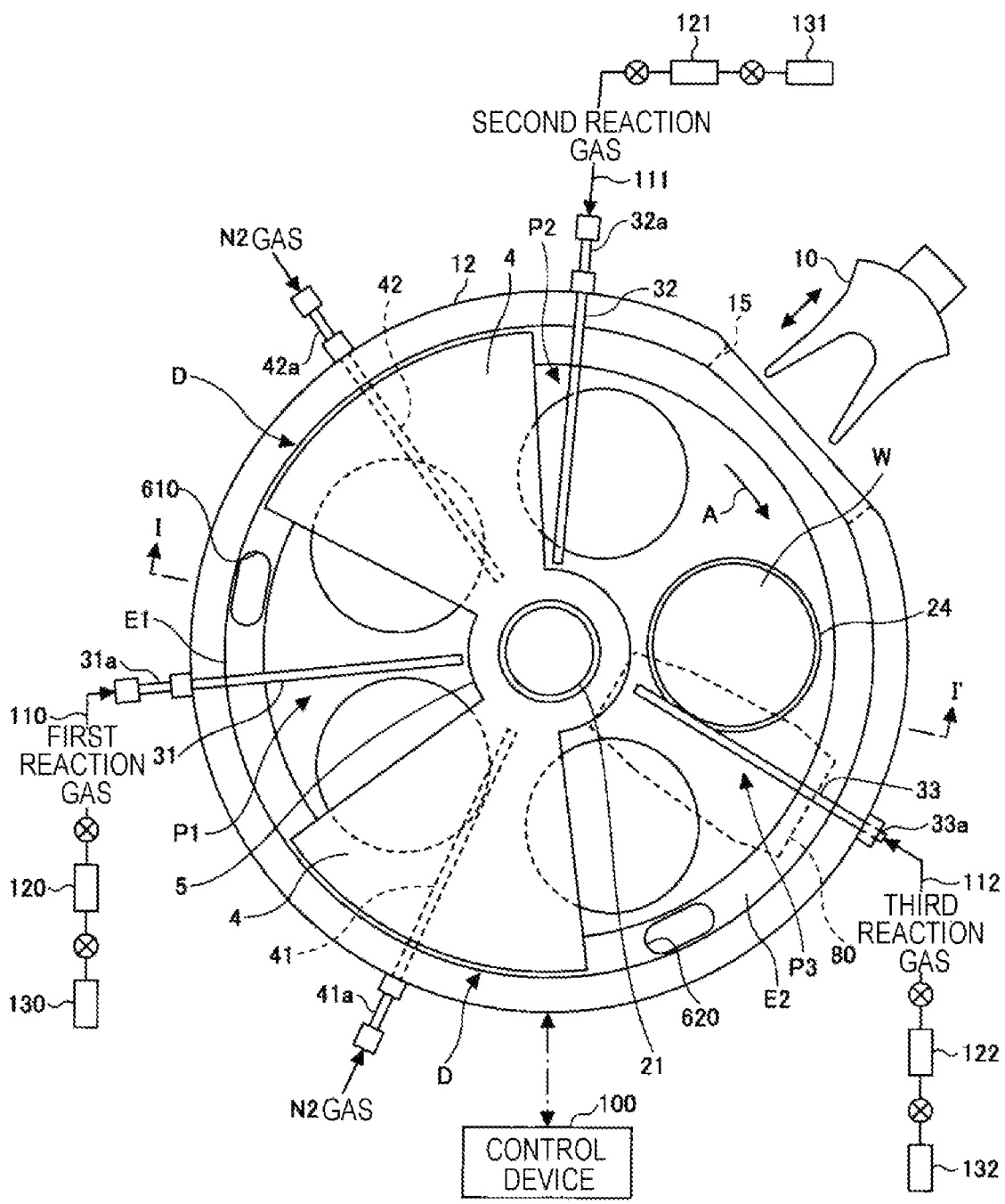
FIG. 3 is a schematic plan view illustrating the internal configuration of the vacuum vessel of the plasma processing apparatus of FIG. 1.

A plasma processing apparatus according to an exemplary embodiment of the present disclosure will be described. FIG. 1 is a schematic vertical sectional view of a plasma processing apparatus according to an exemplary embodiment of the present disclosure. FIG. 2 is a schematic perspective view illustrating an internal configuration of a vacuum vessel of the plasma processing apparatus of FIG. 1. FIG. 3 is a schematic plan view illustrating the internal configuration of the vacuum vessel of the plasma processing apparatus of FIG. 1. Meanwhile, for convenience of descriptions, FIGS. 2 and 3 omit the illustration of a top plate.

With reference to FIGS. 1 to 3, the plasma processing apparatus includes a substantially circular flat vacuum vessel 1, and a rotation table 2 provided inside the vacuum vessel 1 and having a rotation center at the center of the vacuum vessel 1. The vacuum vessel 1 is a processing chamber where a film formation or etching is performed on the surface of a semiconductor wafer (hereinafter, referred to as a "wafer W") as a substrate accommodated inside the processing chamber. The vacuum vessel 1 includes a bottomed cylindrical vessel body 12, and a top plate 11 provided in the airtight and detachable manner via a seal member 13 such as, for example, an O ring, with respect to the upper surface of the vessel body 12.

The rotation table 2 is fixed to a cylindrical core portion 21 at the central portion thereof, and the core portion 21 is fixed to the upper end of a vertically extending rotation shaft 22. The rotation shaft 22 penetrates the bottom portion 14 of the vacuum vessel 1, and the lower end of the rotation shaft 22 is attached to a driving unit 23 that rotates the rotation shaft 22 around the vertical axis. The rotation shaft 22 and the driving unit 23 are accommodated in a top-opened tubular housing body 20. The housing body 20 is airtightly attached, at a flange portion provided on the upper surface thereof the housing body 20, to the lower surface of the bottom portion 14 of the vacuum vessel 1 so that the internal atmosphere of the housing body 20 is kept in the airtight state from the external atmosphere.

On the upper surface of the rotation table 2, circular concave portions 24 (FIG. 3) are formed along the rotation direction (circumferential direction) to place a plurality of wafers W (five wafers in the illustrated example) therein. For the sake of convenience, FIG. 3 illustrates a wafer W placed in only one concave portion 24. The concave portion 24 has an inner diameter slightly (e.g., 4 mm) larger than the diameter of the wafer W and a depth substantially equal to the thickness of the wafer W. Thus, when the wafer W is accommodated in the concave portion 24, the surface of the wafer W and the upper surface of the rotation table 2 (the area where the wafer W is not placed) have the same height. Through holes (all the through holes are not illustrated) are formed on the bottom surface of the concave portion 24 such that, for example, three lifting pins penetrate the through holes to support the rear surface of the wafer W and move the wafer W up and down.

Reaction gas nozzles 31, 32, and 33 and separation gas nozzles 41 and 42 which are made of, for example, quartz are arranged above the rotation table 2 at intervals in the circumferential direction of the vacuum vessel 1 (the direction indicated by arrow A in FIG. 3). In the illustrated example, the reaction gas nozzle 33, the separation gas nozzle 41, the reaction gas nozzle 31, the separation gas nozzle 42, and the reaction gas nozzle 32 are arranged in this order in the clockwise direction (the rotation direction of the rotation table 2) from a conveyance port 15 to be described later. Gas introduction ports 31a, 32a, and 33a (FIG. 3) as the base end portions of the respective reaction gas nozzles 31, 32, and 33 are fixed to the outer peripheral wall of the vessel body 12 so that the reaction gas nozzles 31, 32, and 32 are introduced into the vacuum vessel 1 from the outer peripheral wall of the vacuum vessel 1. Further, the reaction gas nozzles 31, 32, and 33 are attached to extend horizontally with respect to the rotation table 2 along the radial direction of the vessel body 12. In addition, gas introduction ports 41a and 42a (FIG. 3) as the base ends portions of the respective separation gas nozzles 41 and 42 are fixed to the outer peripheral wall of the vessel body 12 so that the separation gas nozzles 41 and 42 are introduced into the vacuum vessel 1 from the outer peripheral wall of the vacuum vessel 1. Further, the separation gas nozzles 41 and 42 are attached to extend horizontally with respect to the rotation table 2 along the radial direction of the vessel body 12.

In the present exemplary embodiment, the reaction gas nozzle 31 is connected to a first reaction gas supply source 130 via, for example, a pipe 110 and a flow rate controller 120. The reaction gas nozzle 32 is connected to a second reaction gas supply source 131 via, for example, a pipe 111 and a flow rate controller 121. The reaction gas nozzle 33 is connected to a third reaction gas supply source 132 via, for example, a pipe 112 and a flow rate controller 122. The separation gas nozzles 41 and 42 are connected to separation gas supply sources (not illustrated) via, for example, pipes (not illustrated) and flow rate controllers (not illustrated). As the separation gas, a rare gas such as, for example, helium (He) gas or argon (Ar) gas, or an inert gas such as, for example, nitrogen ($N_2$) gas may be used. In the present exemplary embodiment, the example where $N_2$ gas is used will be described.

In the reaction gas nozzles 31, 32, and 33, a plurality of gas ejection holes 35 opened toward the rotation table 2 are arranged along the longitudinal direction of each of the reaction gas nozzles 31, 32, and 33 at an interval of, for example, 10 mm. Thus, a first reaction gas, a second reaction gas, and a third reaction gas may be supplied to the upper surface of the rotation table 2 from the reaction gas nozzles 31, 32, and 33.

The area below the reaction gas nozzle 31 is a first processing area P1 where the first reaction gas is adsorbed to the wafer W. The area below the reaction gas nozzle 32 is a second processing area P2 where the second reaction gas reacting with the first reaction gas adsorbed to the wafer W in the first processing area P1 is supplied, and a molecular layer of the reaction product is generated. The molecular layer of the reaction product constitutes a film to be formed. The area below the reaction gas nozzle 33 is a third processing area P3 where the third reaction gas is supplied to the reaction product (film) generated in the second processing area P2 to modify the reaction product.

A plasma generating apparatus 80 is provided above the third processing area P3. In FIG. 3, the plasma generating apparatus 80 is illustrated simply in a dashed line. Details of the plasma generating apparatus 80 will be described later.

While the first reaction gas may include various gases, a raw material gas serving as a raw material of a film to be formed is selected. For example, when a silicon oxide film ($SiO_2$ film) is formed, a silicon-containing gas such as, for example, organic aminosilane is selected. For example, when a metal oxide film is formed, a reaction gas containing the metal element of the metal oxide film is selected. For example, when a titanium oxide film ($TiO_2$ film) as a type of the metal oxide film is formed, a gas containing titanium (Ti) such as, for example, $TiO_2$ is selected.

As the second reaction gas, various reaction gases may be used as long as the reaction gases may react with the first reaction gas and generate a reaction product. For example, when an oxide film such as, for example, a $SiO_2$ film or a metal oxide film is formed, an oxidizing gas is selected. For example, when a nitride film such as, for example, a silicon nitride film (SiN film) or a metal nitride film is formed, a nitriding gas is selected. For example, when a $SiO_2$ film is formed, a gas such as, for example, $O_3$ is selected. When a $TiO_2$ film is formed, a gas such as, for example, $H_2O$ or $H_2O_2$ is selected. When a SiN film or a TiN film is formed, a gas such as, for example, $NH_3$ is selected.

As the third reaction gas, various modifying gases may be used as long as the modifying gases may rearrange the elements in the reaction product generated by the reaction between the first and second reaction gases, and densify (increase the density of) the film formed by the reaction product. For example, when a $SiO_2$ film is formed, Ar gas or a mixed gas of Ar gas and $O_2$ gas is selected.

With reference to FIGS. 2 and 3, two convex portions 4 are formed in the vacuum vessel 1. Since the convex portions 4 constitute separation areas D together with the separation gas nozzles 41 and 42, the convex portions 4 are attached to the rear surface of the top plate 11 to protrude toward the rotation table 2. In addition, each convex portion 4 has a fan-shaped planar shape cut in an arc shape at the top portion thereof. In the present exemplary embodiment, the inner arc is connected to a protruding portion 5, and the outer arc follows the inner peripheral surface of the vessel body 12 of the vacuum vessel 1.

Figure 4:
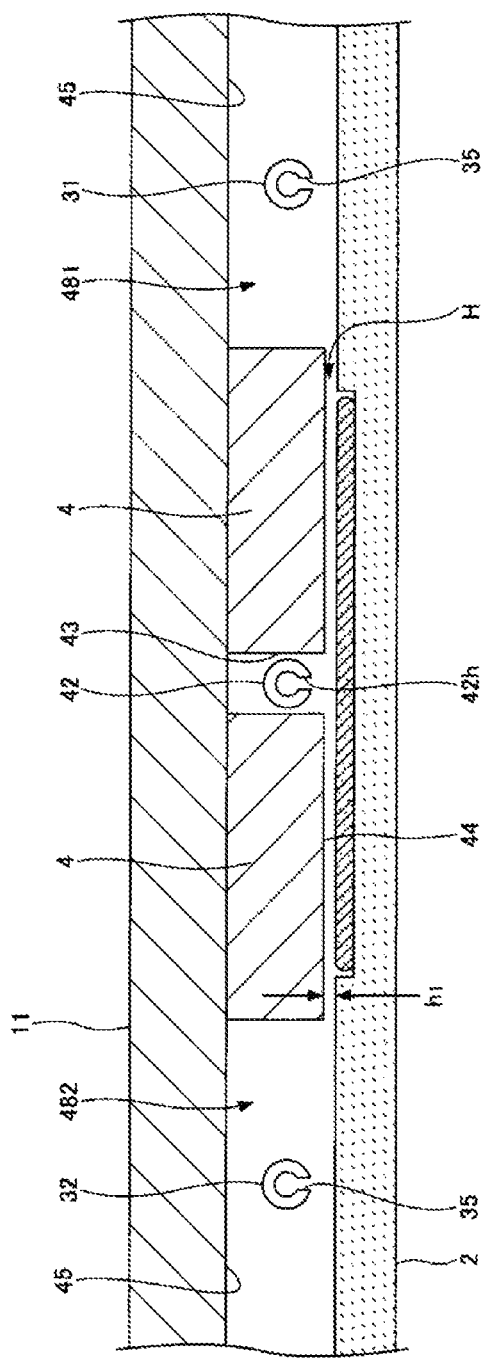
FIG. 4 is a schematic sectional view of the vacuum vessel which is taken along the concentric circle of a rotation table of the plasma processing apparatus of FIG. 1.
Figure 5:
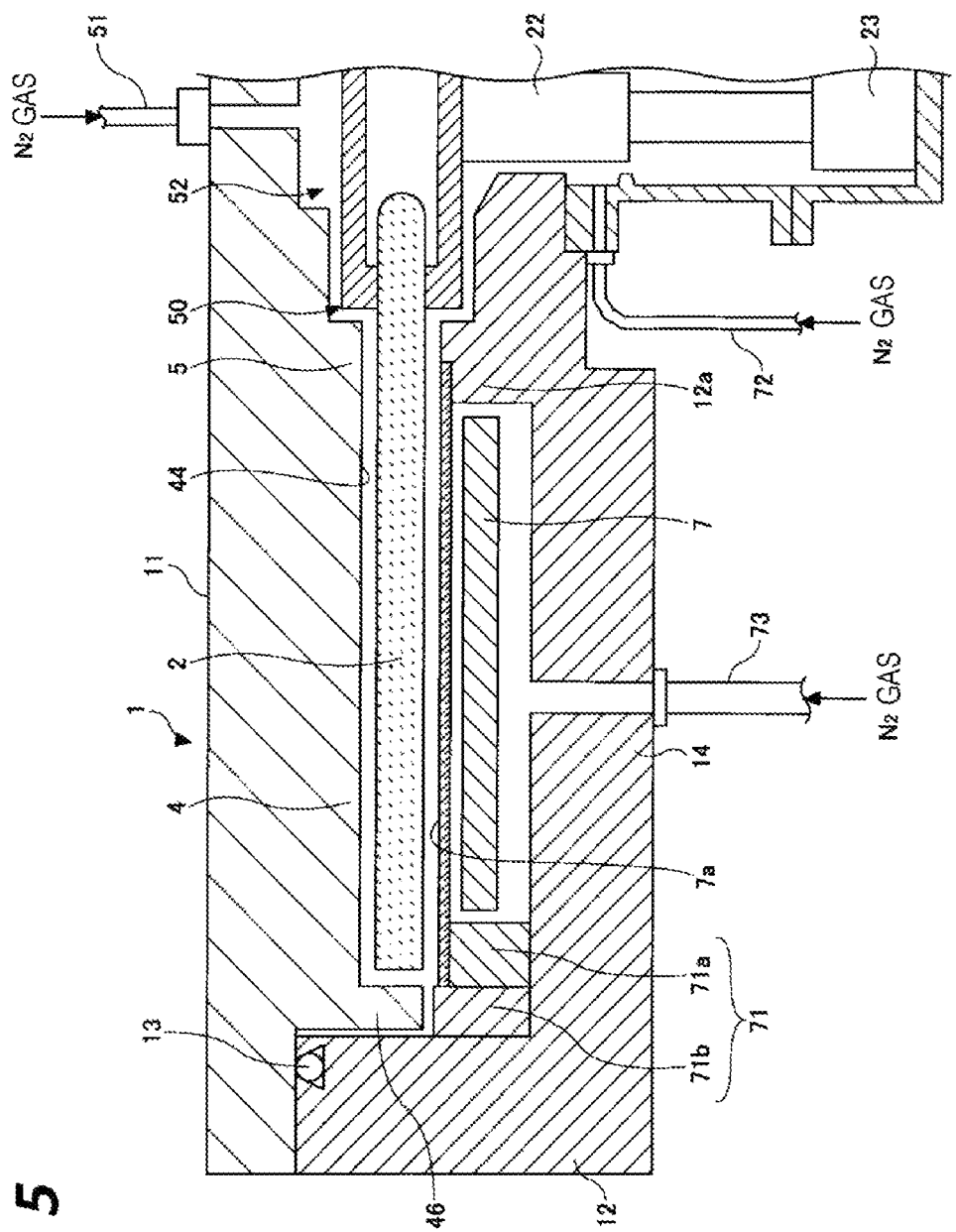
FIG. 5 is another schematic sectional view of the plasma processing apparatus of FIG. 1.

FIG. 4 is a schematic sectional view of the vacuum vessel which is taken along the concentric circle of the rotation table of the plasma processing apparatus of FIG. 1. FIG. 5 is another schematic sectional view of the plasma processing apparatus of FIG. 1.

As illustrated in FIG. 4, since the convex portion 4 is attached to the rear surface of the top plate 11, a flat lower ceiling surface 44 as the lower surface of the convex portion 4 and an upper ceiling surface 45 positioned on the circumferentially opposite sides of the ceiling surface 44 and higher than the ceiling surface 44 exist in the vacuum vessel 1. The ceiling surface 44 has a fan-shaped planar shape cut in an arc shape at the top portion thereof. As illustrated, a groove portion 43 is formed in the convex portion 4 to extend radially from the circumferential center of the convex portion 4, and the separation gas nozzle 42 is accommodated in the groove portion 43. Further, the groove portion 43 is also formed in the other convex portion 4, and the separation gas nozzle 41 is accommodated in the groove portion 43. In addition, the reaction gas nozzles 31 and 32 are provided in the spaces below the higher ceiling surface 45, respectively. The reaction gas nozzles 31 and 32 are spaced apart from the ceiling surface 45 and provided in the vicinity of the wafer W. The reaction gas nozzle 31 is provided in the right space 481 below the higher ceiling surface 45, and the reaction gas nozzle 32 is provided in the left space 482 below the higher ceiling surface 45. In the reaction gas nozzles 31, 32, and 33, the plurality of gas ejection holes 35 opened toward the rotation table 2 are arranged along the longitudinal direction of each of the reaction gas nozzles 31, 32, and 33 at an interval of, for example, 10 mm.

In the separation gas nozzles 41 and 42 accommodated in the groove portions 43 of the convex portions 4, a plurality of gas ejection holes 42h opened toward the rotation table 2 are arranged along the longitudinal direction of each of the separation gas nozzles 41 and 42 at an interval of, for example, 10 mm.

The ceiling surface 44 forms a narrow separation space H with respect to the rotation table 2. When $N_2$ gas is supplied from the gas ejection holes 42h of the separation gas nozzle 42, the $N_2$ gas flows toward the spaces 481 and 482 through the separation space H. At this time, since the volume of the separation space H is smaller than the volumes of the spaces 481 and 482, the pressure of the separation space H may become higher than the pressures of the spaces 481 and 482 by the $N_2$ gas. That is, the separation space H having a high pressure is formed between the spaces 481 and 482. In addition, the $N_2$ gas flowing out from the separation space H into the spaces 481 and 482 acts as a counter flow against the first reaction gas from the first processing area P1 and the second reaction gas from the second processing area P2. Thus, the first reaction gas from the first processing area P1 and the second reaction gas from the second processing area P2 are separated from each other by the separation space H. Therefore, the first and second reaction gases are suppressed from being mixed and reacting with each other in the vacuum vessel 1.

The height h1 of the ceiling surface 44 from the upper surface of the rotation table 2 may be set to be suitable for making the pressure of the separation space H higher than the pressures of the spaces 481 and 482, in consideration of the pressure in the vacuum vessel 1 during the film formation, the rotation speed of the rotation table 2, the supply amount of the separation gas ($N_2$ gas) to be supplied and others.

Meanwhile, the protruding portion 5 (FIGS. 2 and 3) is formed on the lower surface of the top plate 11 to surround the outer periphery of the core portion 21 that fixes the rotation table 2. In the present exemplary embodiment, the protruding portion 5 is continuous to the portion of the convex portion 4 on the side of the rotation center, and the lower surface of the protruding portion 5 is formed at the same height as that of the ceiling surface 44.

FIG. 1 referred to above is a sectional view taken along line I-I' of FIG. 3 and illustrates the area where the ceiling surface 45 is provided. Meanwhile, FIG. 5 is a sectional view illustrating the area where the ceiling surface 44 is provided. As illustrated in FIG. 5, a bent portion 46 is formed at the peripheral portion (the portion on the side of the outer edge portion of the vacuum vessel 1) of the fan-shaped convex portion 4 to be bent in the L shape and face the outer end surface of the rotation table 2. Like the convex portion 4, the bent portion 46 also suppresses the reaction gases from both the separation areas D from being introduced and mixed with each other. Since the fan-shaped convex portion 4 is provided on the top plate 11, and the top plate 11 is configured to be detachable from the vessel body 12, a slight gap exists between the outer peripheral surface of the bent portion 46 and the vessel body 12. Each of the gap between the inner peripheral surface of the bent portion 46 and the outer end surface of the rotation table 2 and the gap between the outer peripheral surface of the bent portion 46 and the vessel body 12 is set to have the same dimension as the height of the ceiling surface 44 from the upper surface of the rotation table 2.

In the separation regions D, as illustrated in FIG. 5, the inner peripheral wall of the vessel body 12 is formed on the vertical surface close to the outer peripheral surface of the bent portion 46. Meanwhile, in the portions other than the separation areas D, as illustrated in FIG. 1, the inner peripheral wall of the vessel body 12 is recessed outwardly, for example, throughout the range from the portion facing the outer end surface of the rotation table 2 to the bottom portion 14. Hereinafter, for convenience of descriptions, the recessed portion that has the substantially rectangular sectional shape will be described as an exhaust area E. Specifically, the exhaust area communicating with the first processing area P1 will be described as a first exhaust area E1, and the area communicating with the second and third processing areas P2 and P3 will be described as a second exhaust area E2. As illustrated in FIGS. 1 to 3, a first exhaust port 610 and a second exhaust port 620 are formed at the bottom portions of the first exhaust area E1 and the second exhaust area E2, respectively. As illustrated in FIG. 1, each of the first exhaust port 610 and the second exhaust port 620 is connected to, for example, a vacuum pump 640 as a vacuum exhaust unit via an exhaust pipe 630. Further, a pressure controller 650 is provided between the vacuum pump 640 and the exhaust pipe 630.

As illustrated in FIGS. 2 and 3, the separation space H is not formed between the second processing area P2 and the third processing area P3. However, in FIG. 3, a housing is provided in the area illustrated as the plasma generating apparatus 80 to partition the space above the rotation table 2. The housing also serves as an area where the plasma generating device 80 is mounted. This point will be described in detail later.

As illustrated in FIGS. 1 and 5, a heater unit 7 as a heating unit is provided in the space between the rotation table 2 and the bottom portion 14 of the vacuum vessel 1, and the wafers W on the rotation table 2 are heated to a temperature determined by a process recipe via the rotation table 2. A ring-shaped cover member 71 is provided below the portion near the peripheral edge portion of the rotation table 2 (FIG. 5). Thus, the atmosphere ranging from the space above the rotation table 2 to the first exhaust area E1 and the second exhaust area E2 and the atmosphere where the heater unit 7 is placed are partitioned so that the introduction of a gas into the area below the rotation table 2 may be suppressed. The cover member 71 includes an inner member 71*a* provided to face, from the lower side, the outer edge portion of the rotation table 2 and the outer peripheral side from the outer edge portion of the rotation table 2, and an outer member 71*b* provided between the inner member 71*a* and the inner wall surface of the vacuum vessel 1. In the separation areas D, the outer member 71*b* is provided below and close to the bent portion 46 formed at the outer edge portion of the convex portion 4. The inner member 71*a* surrounds the heater unit 7 throughout the entire circumference of the heater unit 7, below the outer edge portion of the rotation table 2 (and below the slightly outer portion from the outer edge portion).

The bottom portion 14 at the portion close to the rotation center from the space where the heater unit 7 is disposed protrudes upward and approaches the core portion 21 in the vicinity of the central portion of the lower surface of the rotation table 2, so as to constitute a protruding portion 12*a*. The space between the protruding portion 12*a* and the core portion 21 is narrow, and the gap between the inner peripheral surface of the through hole of the bottom portion 14 which is penetrated by the rotation shaft 22 and the rotation shaft 22 is narrow. These narrow spaces communicate with the housing body 20. In the housing body 20, a purge gas supply pipe 72 is provided to supply $N_2$ gas as a purge gas into the narrow space and purge the space. Further, a plurality of purge gas supply pipes 73 are provided in the bottom portion 14 of the vacuum vessel 1 below the heater unit 7 at a predetermined circumferential angular interval, to purge the space where the heat unit 7 is disposed (FIG. 5 illustrates one purge gas supply pipe 73). In addition, a cover member 7*a* is provided between the heater unit 7 and the rotation table 2 to circumferentially cover the space between the inner peripheral wall of the outer member 71*b* (the upper surface of the inner member 71*a*) and the upper end portion of the protruding portion 12, in order to suppress the introduction of a gas into the area where the heater unit 7 is provided. The cover member 7*a* may be made of, for example, quartz.

In addition, a separation gas supply pipe 51 is connected to the central portion of the top plate 11 of the vacuum vessel 1, and configured to supply $N_2$ gas as the separation gas into the space 52 between the top plate 11 and the core portion 21. The separation gas supplied into the space 52 is ejected toward the peripheral edge portion of the rotation table 2 along the surface of the rotation table 2 on which the wafers are placed, through the narrow gap 50 between the protruding portion 5 and the rotation table 2. The gap 50 may be kept at the pressure higher than those in the spaces 481 and 482 by the separation gas. Thus, by the gap 50, the first reaction gas supplied to the first processing area P1 and the second reaction gas supplied to the second processing area P2 are suppressed from being mixed with each other through a central area C. That is, the gap 50 (or the central area C) may function as the separation space H (or the separation areas D).

As illustrated in FIGS. 2 and 3, the conveyance port 15 is formed on the side wall of the vacuum vessel 1 to exchange the wafers W between an external conveyance arm 10 and the rotation table 2. The conveyance port 15 is opened and closed by a gate valve (not illustrated). The concave portion 24 as the wafer placing area on the rotation table 2 exchanges a wafer W with the conveyance arm 10 at the position facing the conveyance port 15. Hence, exchange lift pins and a lift mechanism thereof (these components are not illustrated) are provided at the portion corresponding to the exchange position below the rotation table 2, to penetrate the concave portion 24 and lift the wafer W from the rear surface thereof.

Figure 6:
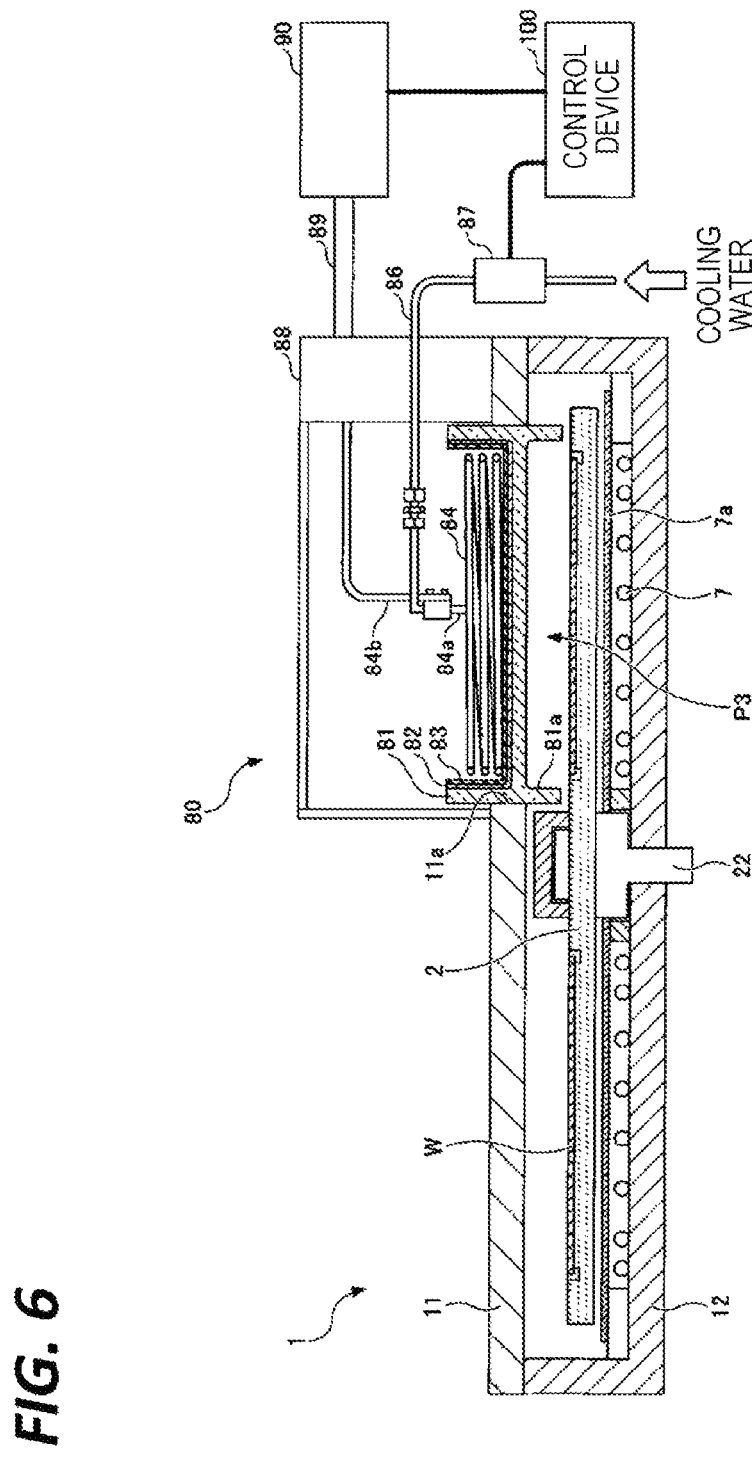
FIG. 6 is a schematic sectional view illustrating a plasma generating apparatus provided in the plasma processing apparatus of FIG. 1.

Next, the plasma generating apparatus 80 will be described. FIG. 6 is a schematic sectional view illustrating a plasma generating apparatus provided in the plasma processing apparatus of FIG. 1.

As illustrated in FIG. 6, the plasma generating apparatus 80 is formed of a high frequency transmitting material, has a concave portion recessed from the upper surface thereof, and includes a frame member 81, a Faraday shielding plate 82, an insulating plate 83, and an antenna 84. The frame member 81 is fitted into an opening 11a formed in the top plate 11. The Faraday shielding plate 82 is accommodated in the concave portion of the frame member 81 and has a substantially top-opened box shape. The insulating plate 83 is disposed on the bottom surface of the Faraday shielding plate 82. The antenna 84 is supported above the insulating plate 83 and formed in a coil shape having a substantially octagonal upper surface shape.

The lower surface of the frame member 81 faces the rotation table 2 in the vacuum vessel 1, and a protrusion 81a is formed on the outer periphery of the lower surface of the frame member 81 to protrude downward (toward the rotation table 2) throughout the entire circumference of the frame member 81. The lower surface of the protrusion 81a is close to the upper surface of the rotation table 2, and the space above the rotation table 2 (hereinafter, referred to as a "third processing area P3") is partitioned by the protrusion 81a, the upper surface of the rotation table 2, and the lower surface of the frame member 81. In addition, the spacing between the lower surface of the protrusion 81a and the upper surface of the rotation table 2 may be substantially the same as the height h1 of the ceiling surface 44 from the upper surface of the rotation table 2 in the separation space H (FIG. 5).

Although not illustrated, in the third processing area P3, a reaction gas nozzle 33 extends through the protrusion 81a. As illustrated in FIG. 3, a third reaction gas supply source 132 is connected to the reaction gas nozzle 33 by a pipe 112 via a flow rate controller 122 to fill the third reaction gas. The third reaction gas of which the flow rate is controlled by the flow rate controller 122 is supplied to the third processing area P3.

The Faraday shielding plate 82 is formed of a conductive material such as, for example, a metal, and although not illustrated, the Faraday shielding plate 82 is grounded. A plurality of slits (not illustrated) are formed in the bottom portion of the Faraday shielding plate 82, and the respective slits extend to be substantially orthogonal to the corresponding sides of the antenna 84 having the substantially octagonal planar shape.

The insulating plate 83 is made of, for example, quartz glass, has a size slightly smaller than the bottom surface of the Faraday shielding plate 82, and is placed on the bottom surface of the Faraday shield plate 82. The insulating plate 83 insulates the Faraday shielding plate 82 and the antenna 84, and transmits the high frequency radiated from the antenna 84 downward.

The antenna 84 is formed in the coil shape by winding a hollow tube made of a copper with, for example, three turns such that the planar shape becomes substantially octagonal. Cooling water may be distributed inside the hollow tube. By circulating the cooling water inside the hollow tube, the antenna 84 may be suppressed from being heated to a high temperature due to the high frequency supplied to the antenna 84. In addition, an L-shaped portion 81a is formed in the antenna 84.

A cooling water supply pipe 86 is connected to the tip end of the L-shaped portion 84a to supply the cooling water into the hollow tube. In addition, a conductivity meter 87 is provided in the flow path of the cooling water supply pipe 86 to measure the conductivity of the cooling water distributed inside the cooling water supply pipe 86. The conductivity meter 87 is connected to a control device 100.

Further, a high frequency power supply 90 is connected to the L-shaped portion 84a via an L-shaped portion 84b, a matching box 88, and a coaxial cable 89. The high frequency power supply 90 may generate a high frequency having a frequency of, for example, 13.56 MHz. The high frequency power supply 90 is connected to the control device 100.

According to the plasma generating apparatus 80 having the above-described configuration, when a high frequency power is supplied to the antenna 84 from the high frequency power supply 90 via the matching box 88, an electromagnetic field is generated by the antenna 84. Since the electric field components of the electromagnetic field are shielded by the Faraday shielding plate 82, the electric field components may not propagate downward. Meanwhile, the magnetic field components propagate into the third processing area P3 through the plurality of slits of the Faraday shielding plate 82. The third reaction gas supplied to the third processing area P3 from the reaction gas nozzle 33 at a predetermined flow rate ratio is activated by the magnetic field components.

As illustrated in FIGS. 1, 3, and 6, the plasma processing apparatus according to the present exemplary embodiment is provided with the control device 100 configured with a computer for controlling the entire operation of the apparatus. The memory of the control device 100 stores a program for causing the plasma generating apparatus 80 to perform the method of controlling the plasma generating apparatus 80 to be described later, under the control by the control device 100. The program is organized with a group of steps to perform the method of controlling the plasma generating apparatus 80, and stored in a medium such as, for example, a hard disk, a compact disk, a magneto-optical disk, a memory card, or a flexible disk. The program stored in the medium is read into the control device 100 by a predetermined reading device and installed in the control device 100.

Further, the control device 100 controls the output of the high frequency power supply 90 based on the conductivity of the cooling water measured by the conductivity meter 87. Specifically, when the conductivity of the cooling water measured by the conductivity meter 87 is larger than a predetermined value, the control device 100 controls the output of the high frequency power supply 90 to increase. Meanwhile, when the conductivity of the cooling water measured by the conductivity meter 87 is smaller than the predetermined value, the control device 100 controls the output of the high frequency power supply 90 to decrease. Accordingly, even when the conductivity of the cooling water circulated inside the hollow tube varies, the output of the high frequency power supply 90 may be controlled to follow the change of the conductivity of the cooling water. Thus, the change of the state of plasma caused from the change of the conductivity of the cooling water may be suppressed. As a result, the stability of the processing such as, for example, the film formation or etching performed inside the vacuum vessel 1 is improved.

Figure 7:
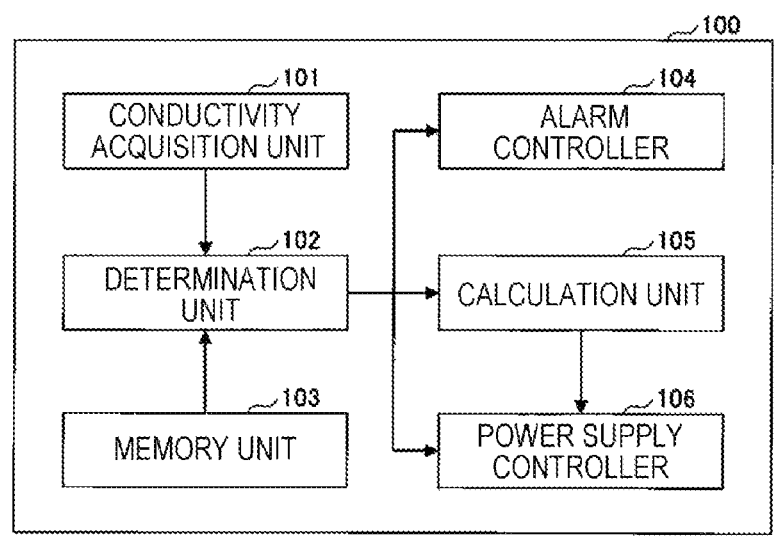
FIG. 7 is a functional configuration diagram of a control device of the plasma processing apparatus of FIG. 1.

Next, an exemplary functional configuration of the control device 100 will be described. FIG. 7 is a functional configuration diagram of the control device of the plasma processing apparatus of FIG. 1.

As illustrated in FIG. 7, the control device 100 includes a conductivity acquisition unit 101, a determination unit 102, a memory unit 103, an alarm controller 104, a calculation unit 105, and a power supply controller 106, and these functions are implemented with a CPU such as, for example, a microcomputer.

The conductivity acquisition unit 101 acquires the conductivity of the cooling water measured by the conductivity meter 87.

The determination unit 102 determines whether the conductivity of the cooling water acquired by the conductivity acquisition unit 101 falls within a safe range. The safe range is stored in advance in the memory unit 103 and may be determined by, for example, preliminary experiments and set to, for example, 2 mS/m (millisiemens/meter) to 15 mS/m. Further, the determination unit 102 determines whether the conductivity of the cooling water is larger than a reference value, and also determines whether the conductivity of the cooling water is smaller than the reference value. The reference value is stored in advance in the memory unit 103, and may be set to a predetermined value that falls within a safe range.

The memory unit 103 stores the values used for the various determinations, for example, the safe ranges and the reference value.

The alarm controller 104 controls the operation of an alarm device to cause the alarm device to make an alarm sound based on the determination result of the determination unit 102.

The calculation unit 105 calculates a power value to be output to the antenna 84 from the high frequency power supply 90, based on the conductivity of the cooling water acquired by the conductivity acquisition unit 101.

The power supply controller 106 controls the operation of the high frequency power supply 90.

(Method of Controlling the Plasma Generating Apparatus)

Figure 8:
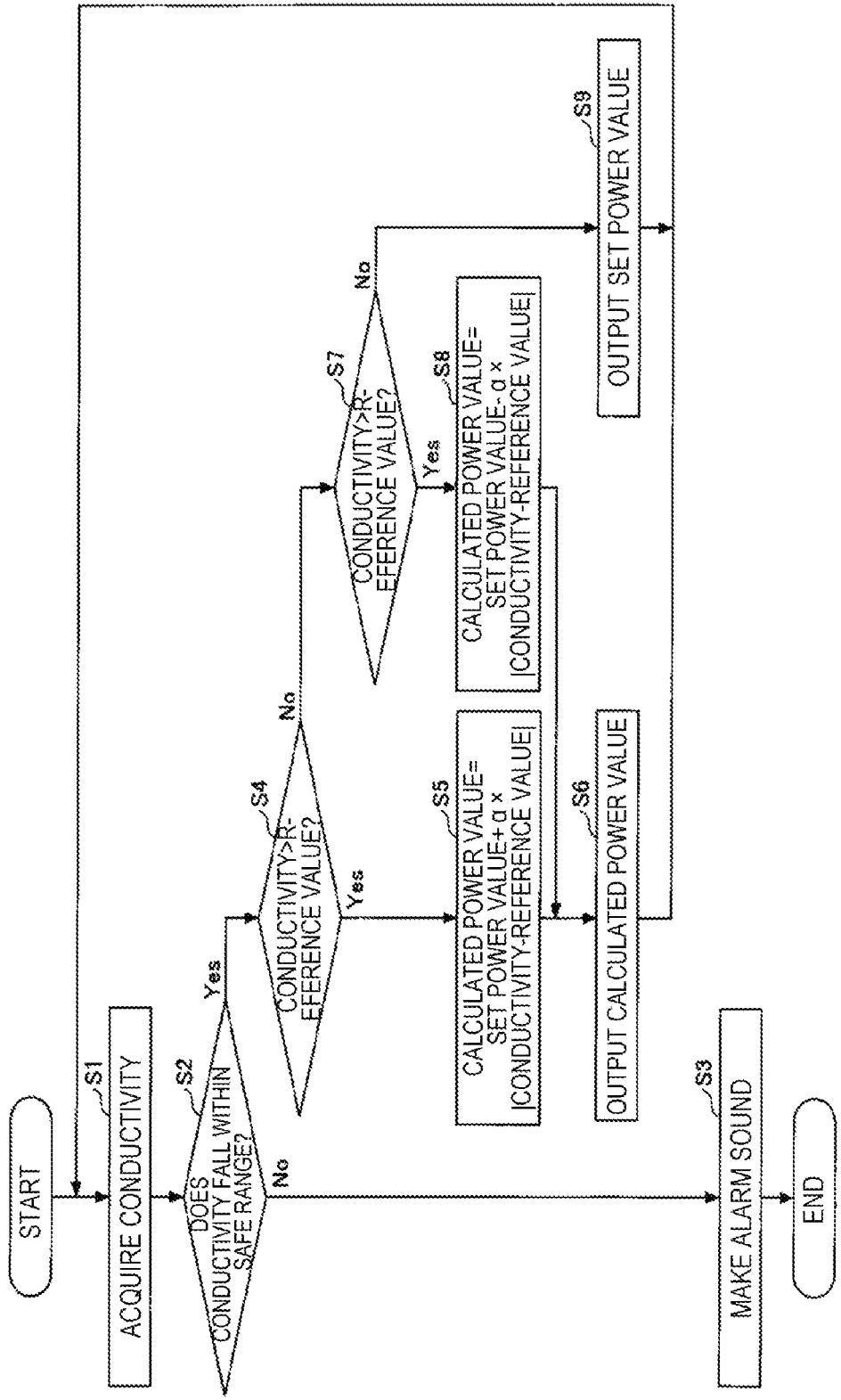
FIG. 8 is a flowchart illustrating a method of controlling the plasma generating apparatus according to the exemplary embodiment of the present disclosure.
Figure 9:
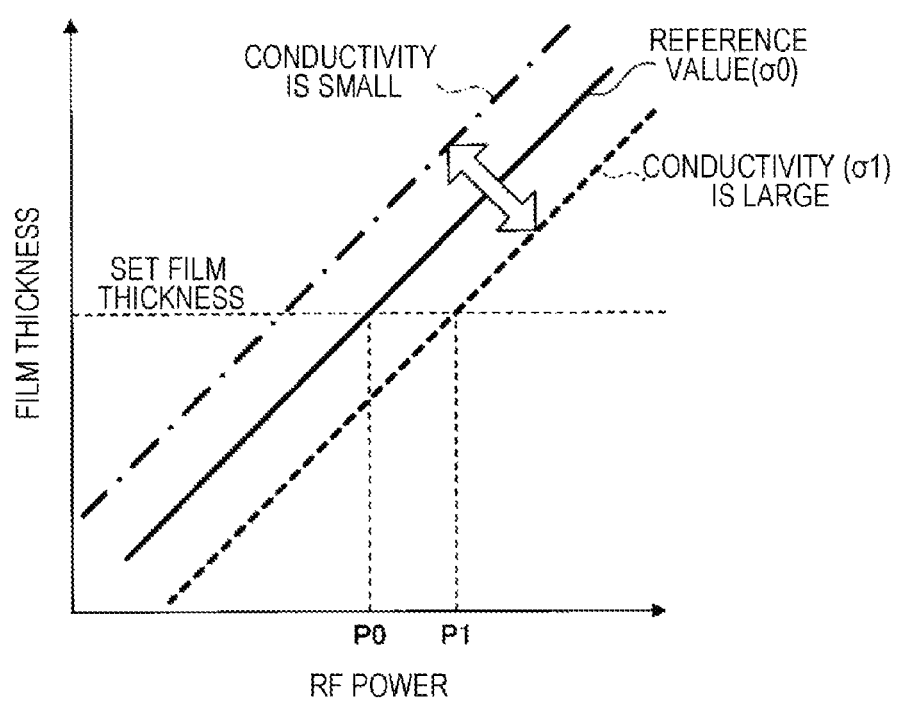
FIG. 9 is a view illustrating an exemplary relationship of output of a high frequency power supply, conductivity of cooling water, and a film thickness.

Next, the method of controlling the plasma generating apparatus according to the present exemplary embodiment will be described. FIG. 8 is a flowchart illustrating the method of controlling the plasma generating apparatus according to the present exemplary embodiment. FIG. 9 is a view illustrating an exemplary relationship of the output of the high frequency power supply, the conductivity of the cooling water, and the film thickness.

First, the conductivity acquisition unit 101 acquires the conductivity of the cooling water measured by the conductivity meter 87 (step S1).

Subsequently, the determination unit 102 determines whether the conductivity of the cooling water acquired by the conductivity acquisition unit 101 in step S1 falls within the safe range (step S2).

When the determination unit 102 determines in step S2 that the conductivity of the cooling water does not fall within the safe range, the alarm controller 104 controls the operation of the alarm device (not illustrated) to cause the alarm device to make an alarm sound (step S3), and the process is ended. In addition, the alarm controller 104 may control a display device (not illustrated) to display abnormality information, or may control the respective units of the plasma processing apparatus to stop the plasma processing during the processing or stop the subsequent plasma processing on the wafer W.

When the determination unit 102 determines in step S2 that the conductivity of the cooling water falls within the safe range, the determination unit 102 determines whether the conductivity of the cooling water is larger than the reference value (step S4).

When the determination unit 102 determines in step S4 that the conductivity of the cooling water is larger than the reference value, the calculation unit 105 calculates a power value to be output to the antenna 84 from the high frequency power supply 90, based on the conductivity of the cooling water acquired by the conductivity acquisition unit 101 in step S1 (step S5). Then, the power supply controller 106 controls the high frequency power supply 90 to output the power calculated in step S5 (step S6), and the process returns to step S1. Specifically, the calculation unit 105 calculates the power value to be output to the antenna 84 from the high frequency power supply 90 according to the following equation (1), and controls the operation of the high frequency power supply 90 to output the calculated power value.

$$\text{Calculated power value} = \text{set power value} + \alpha \times |\text{conductivity-reference value}| \quad (1)$$

Here, the set power value is a power value input as, for example, a recipe by, for example, an operator. Further, for example, as illustrated in FIG. 9, α is a coefficient calculated from the graph representing the relationship of the output of the high frequency power supply 90, the conductivity of the cooling water, and the film thickness. |Conductivity-reference value| is the absolute value of the difference between the conductivity of the cooling water measured by the conductivity meter and the reference value. In FIG. 9, the horizontal axis indicates the power value (RF power) output to the antenna 84 from the high frequency power supply 90, and the vertical axis indicates the film thickness. Further, in FIG. 9, the solid line represents a case where the conductivity is equal to the reference value, the dashed line represents a case where the conductivity is larger than the reference value, and the alternate long and short dashed line represents a case where the conductivity is smaller than the reference value. In this case, α is calculated by the following equation (2).

$$\alpha = (P1-P0)/(\sigma 1-\sigma 0) \quad (2)$$

Here, σ0 represents the conductivity of the reference value, and σ1 represents the conductivity measured by the conductivity meter 87. Further, P0 is a power value at which the set film thickness may be obtained when the conductivity is σ0, and P1 is a power value at which the set film thickness may be obtained when the conductivity is σ1.

When the determination unit 102 determines in step S4 that the conductivity of the cooling water is equal to or smaller than the reference value, the determination unit 102 determines whether the conductivity of the cooling water is smaller than the reference value (step S7).

When the determination unit 102 determines in step S7 that the conductivity of the cooling water is smaller than the reference value, the calculation unit 105 calculates the power value to be output to the antenna 84 from the high frequency power supply 90, based on the conductivity of the cooling water acquired by the conductivity acquisition unit 101 in step S1 (step S8). Then, the power supply controller 106 controls the high frequency power supply 90 to output the power calculated in step S8 (step S6), and the process returns to step S1. Specifically, the calculation unit 105 calculates the power value to be output to the antenna 84 from the high frequency power supply 90 according to the following equation (3), and controls the operation of the high frequency power supply 90 to output the calculated power value.

$$\text{Calculated power value} = \text{set power value} - \alpha \times |\text{conductivity-reference value}| \tag{3}$$

Here, the set power value is a power value input as, for example, a recipe by an operator or the like. Further, for example, as illustrated in FIG. 9, $\alpha$ is a coefficient calculated from the graph representing the relationship of the output of the high frequency power supply 90, the conductivity of the cooling water, and the film thickness. The term "|conductivity-reference value|" represents the absolute value of the difference between the conductivity of the cooling water measured by the conductivity meter and the reference value.

When the determination unit 102 determines in step S7 that the conductivity of the cooling water is not smaller than the reference value, that is, the conductivity of the cooling water is equal to the reference value, the power supply controller 106 controls the high frequency power supply 90 to output the set power value (step S9), and the process returns to step S1.

As described above, in the method of controlling the plasma generating apparatus according to the present exemplary embodiment, the conductivity of the cooling water inside the hollow tube of the antenna 84 is measured, and the operation of the high frequency power supply 90 is controlled based on the measured conductivity of the cooling water. Thus, even when the conductivity of the cooling water circulated inside the hollow tube varies, the output of the high frequency power supply 90 may be controlled to follow the change of the conductivity of the cooling water. Therefore, the change of the state of plasma caused from the change of the conductivity of the cooling water may be suppressed. As a result, the stability of the processing such as, for example, the film formation or etching performed inside the vacuum vessel 1 is improved.

In the above-described exemplary embodiment, the third reaction gas is an example of a processing gas, and the reaction gas nozzle 33 is an example of a processing gas supply unit. In addition, the rotation table 2 is an example of a placing unit, and the antenna 84 is an example of a plasma generating electrode.

In the above-described exemplary embodiment, a semi-batch type plasma processing apparatus which collectively performs the plasma processing on a plurality of wafers W placed on the rotation table 2 has been described as an example. However, the present disclosure is not limited thereto and may be applied to, for example, a single wafer type plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma generating apparatus comprising:
   a high frequency power supply that generates a high frequency power;
   a plasma generation electrode connected to the high frequency power supply and formed by a hollow tube in which cooling water is distributed;
   a conductivity meter that measures conductivity of the cooling water inside the plasma generation electrode; and
   a controller that controls output of the high frequency power supply based on the conductivity of the cooling water measured by the conductivity meter such that a state of plasma generated by the plasma generation electrode is maintained while the conductivity of the cooling water inside the plasma generation electrode varies.

2. The plasma generating apparatus of claim 1, wherein the controller controls the output of the high frequency power supply to increase when the conductivity of the cooling water measured by the conductivity meter is larger than a predetermined value, and controls the output of the high frequency power supply to decrease when the conductivity of the cooling water measured by the conductivity meter is smaller than the predetermined value.

3. The plasma generating apparatus of claim 2, further comprising:
   an alarm device that makes an alarm sound,
   wherein the controller controls whether the alarm device makes an alarm sound, based on the conductivity of the cooling water measured by the conductivity meter.

4. The plasma generating apparatus of claim 3, wherein when the conductivity of the cooling water does not fall within a predetermined range including the predetermined value, the controller controls the alarm device to make an alarm sound.

5. The plasma generating apparatus of claim 1, wherein the conductivity meter is provided in a flow path of the cooling water supplied into the plasma generation electrode.

6. The plasma generating apparatus of claim 1, wherein the plasma generation electrode is formed in a coil shape.

7. A plasma processing apparatus comprising:
   a processing chamber;
   a placing table provided inside the processing chamber and configured to place a substrate on an upper surface thereof;
   a processing gas supply nozzle provided above the placing table and configured to supply a processing gas to the upper surface of the placing table; and
   a plasma generating apparatus that activates the processing gas supplied by the processing gas supply nozzle,
   wherein the plasma generating apparatus includes:
   a high frequency power supply that generates a high frequency power;
   a plasma generation electrode connected to the high frequency power supply and formed by a hollow tube in which cooling water is distributed;
   a conductivity meter that measures conductivity of the cooling water inside the plasma generation electrode; and
   a controller that controls output of the high frequency power supply based on the conductivity of the cooling water measured by the conductivity meter such that a state of plasma generated by the plasma generation electrode is maintained while the conductivity of the cooling water inside the plasma generation electrode varies.

8. The plasma generating apparatus of claim 1, wherein the plasma generation electrode has a substantially octagonal shape when viewed from a top.

9. The plasma processing apparatus of claim 7, wherein the plasma generation electrode has a substantially octagonal shape when viewed from a top.

* * * * *